(12) United States Patent
De Boeij et al.

(10) Patent No.: US 7,535,644 B2
(45) Date of Patent: May 19, 2009

(54) LENS ELEMENT, LITHOGRAPHIC APPARATUS, DEVICE MANUFACTURING METHOD, AND DEVICE MANUFACTURED THEREBY

(75) Inventors: Wilhelmus Petrus De Boeij, Veldhoven (NL); Johannes Catharinus Hubertus Mulkens, Waalre (NL); Tammo Uitterdijk, De Bilt (NL)

(73) Assignee: ASML Netherlands B.V., Veldhoven (NL)

( * ) Notice: Subject to any disclaimer, the term of this patent is extended or adjusted under 35 U.S.C. 154(b) by 145 days.

(21) Appl. No.: 11/202,370

(22) Filed: Aug. 12, 2005

(65) Prior Publication Data

US 2007/0035845 A1    Feb. 15, 2007

(51) Int. Cl.
*G02B 27/10* (2006.01)
*G03B 21/60* (2006.01)

(52) U.S. Cl. .................................. 359/619; 359/454
(58) Field of Classification Search ......... 359/619–624, 359/443, 454–457, 618, 460, 665, 626
See application file for complete search history.

(56) References Cited

U.S. PATENT DOCUMENTS

| | | | |
|---|---|---|---|
| 3,532,038 A * | 10/1970 | Rottmann | ................... 359/619 |
| 3,573,975 A | 4/1971 | Dhaka et al. | |
| 3,648,587 A | 3/1972 | Stevens | |
| 4,129,628 A * | 12/1978 | Tamutus | ................... 264/2.5 |
| 4,346,164 A | 8/1982 | Tabarelli et al. | |
| 4,390,273 A | 6/1983 | Loebach et al. | |
| 4,396,705 A | 8/1983 | Akeyama et al. | |
| 4,480,910 A | 11/1984 | Takanashi et al. | |
| 4,509,852 A | 4/1985 | Tabarelli et al. | |
| 5,040,020 A | 8/1991 | Rauschenbach et al. | |
| 5,610,683 A | 3/1997 | Takahashi | |
| 5,715,039 A | 2/1998 | Fukuda et al. | |
| 5,825,043 A | 10/1998 | Suwa | |
| 5,900,354 A | 5/1999 | Batchelder | |
| 6,191,429 B1 | 2/2001 | Suwa | |
| 6,236,634 B1 | 5/2001 | Lee et al. | ................... 369/112 |
| 6,519,092 B2 | 2/2003 | Yamaguchi | |
| 6,560,032 B2 | 5/2003 | Hatano | |
| 6,583,855 B2 * | 6/2003 | Krikke et al. | ................. 355/67 |
| 6,600,547 B2 | 7/2003 | Watson et al. | |
| 6,603,130 B1 | 8/2003 | Bisschops et al. | |
| 6,632,375 B2 * | 10/2003 | Rabarot et al. | ................. 216/26 |
| 6,633,365 B2 | 10/2003 | Suenaga | |
| 6,788,477 B2 | 9/2004 | Lin | |

(Continued)

FOREIGN PATENT DOCUMENTS

DE          DD 206 607          2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Scott J Sugarman
*Assistant Examiner*—Dawayne A Pinkney
(74) *Attorney, Agent, or Firm*—Pillsbury Winthrop Shaw Pittman LLP

(57) ABSTRACT

A lens element comprises a first face and a second face, where the first face comprises a plurality of concave shaped lens parts. Each concave shaped lens part is arranged to focus a portion of a beam incident on the second face via a liquid on a single flat surface.

20 Claims, 10 Drawing Sheets

U.S. PATENT DOCUMENTS

| | | | |
|---|---|---|---|
| 2001/0008440 A1 | 7/2001 | Hummel et al. | |
| 2002/0020821 A1 | 2/2002 | Van Santen et al. | 250/492 |
| 2002/0163629 A1 | 11/2002 | Switkes et al. | |
| 2003/0123040 A1 | 7/2003 | Almogy | |
| 2003/0174408 A1 | 9/2003 | Rostalski et al. | |
| 2004/0000627 A1 | 1/2004 | Schuster | |
| 2004/0021844 A1 | 2/2004 | Suenaga | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0119954 A1 | 6/2004 | Kawashima et al. | |
| 2004/0125351 A1 | 7/2004 | Krautschik | |
| 2004/0135099 A1 | 7/2004 | Simon et al. | |
| 2004/0136494 A1 | 7/2004 | Lof et al. | |
| 2004/0160582 A1 | 8/2004 | De Smit et al. | |
| 2004/0165159 A1 | 8/2004 | Lof et al. | |
| 2004/0180299 A1 | 9/2004 | Rolland et al. | |
| 2004/0189964 A1* | 9/2004 | Nijmeijer et al. | 355/55 |
| 2004/0207824 A1 | 10/2004 | Lof et al. | |
| 2004/0211920 A1 | 10/2004 | Derksen et al. | |
| 2005/0068499 A1 | 3/2005 | Dodoc et al. | |
| 2005/0094116 A1 | 5/2005 | Flagello et al. | |
| 2005/0094119 A1 | 5/2005 | Loopstra et al. | |
| 2005/0110973 A1 | 5/2005 | Streefkerk et al. | |
| 2005/0132914 A1 | 6/2005 | Mulkens et al. | |
| 2005/0134815 A1 | 6/2005 | Van Santen et al. | |
| 2005/0151942 A1 | 7/2005 | Kawashima | |
| 2005/0200815 A1* | 9/2005 | Akamatsu | 353/53 |
| 2006/0012885 A1 | 1/2006 | Beder et al. | |
| 2006/0077369 A1* | 4/2006 | Wagner | 355/55 |
| 2006/0245072 A1* | 11/2006 | Venema | 359/666 |
| 2006/0261288 A1* | 11/2006 | Van Santen | 250/492.1 |

FOREIGN PATENT DOCUMENTS

| | | |
|---|---|---|
| DE | DD 221 563 | 4/1985 |
| DE | DD 224448 | 7/1985 |
| DE | DD 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/081666 A1 | 9/2004 |
| WO | WO 2005/081067 A1 | 9/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.

G. Owen et al., "⅛ µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial λ/NA scaling equations for resolution, depth of focus, and immersion lithography, J. Microlith., Microfab., Microsyst. 1(1):7-12 (2002).

Lammers D., "Doped Water Could Extend 193-nm Immersion Litho", http://www.eetimes.com/news/latest/showArticle.jhtml;jsessionid=HHLGOGLVMDOI; Jan. 2004.

European Search Report for EP Application No. 05255959.8, dated Jan. 16, 2006.

* cited by examiner

LENS ELEMENT, LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates to lens element, a lithographic apparatus, a device manufacturing method and a device manufactured thereby.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA (when supported by the lens) of the system and also increasing the depth of focus.) Several immersion liquids have been proposed.

In the case of the immersion lithography in which the area between the substrate and a last lens of the projection system is filled with liquid, the lens numerical aperture (NA) is limited to one which is dependent on its refractive index (even if the refractive index of the liquid is greater than that of the lens) in order to prevent total internal reflection of the projected beam as it passes from the lens to the liquid on its path to the substrate. This limits the angles in which the projected beam can pass safely through the lens and the liquid to the substrate. One way to overcome this limitations is to make the lens out of a material with a larger refractive index, but none greater than n=1.56 is confirmed as being suitable for use at the time of writing.

Another way to overcome the limitation of the angles in which the projected beam can pass safely through the lens and the liquid to the substrate is described in a patent application filed as a U.S. patent application Ser. No. 10/959,403, filed Oct. 7, 2004, in the name of the applicant of this application. The document proposes to provide a curved lens element, in which the lens-liquid boundary is curved by using a curved lens element. This enables a numerical aperture not to be limited by the refractive index of the material, but by the curvature of the surface of the lens. However, by providing a concave lens-liquid boundary, the distance between the curved lens element and the substrate is increased. Particularly in the centre of the curved lens element the distance between the curved lens element and the substrate may be a factor ten larger compared to a substantially flat lens-liquid boundary.

In case of immersion lithography in which the area between the substrate and a last lens (closest to the substrate) of the projection system is filled with liquid, this increased lens-substrate distance may cause problems, as the optical path of the radiation beam through the liquid is increased, considerably reducing the intensity of the radiation beam at the substrate level. Also, the arrangement relatively takes up a lot of space.

SUMMARY OF THE INVENTION

According to an aspect of the invention, there is provided a lens element, including a first face and a second face, the first face including a plurality of concave shaped lens parts, each arranged to focus a portion of a beam incident on the second face via a liquid on a single flat surface.

According to further aspects of the invention, there is provided a lithographic projection apparatus and a device manufacturing method.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
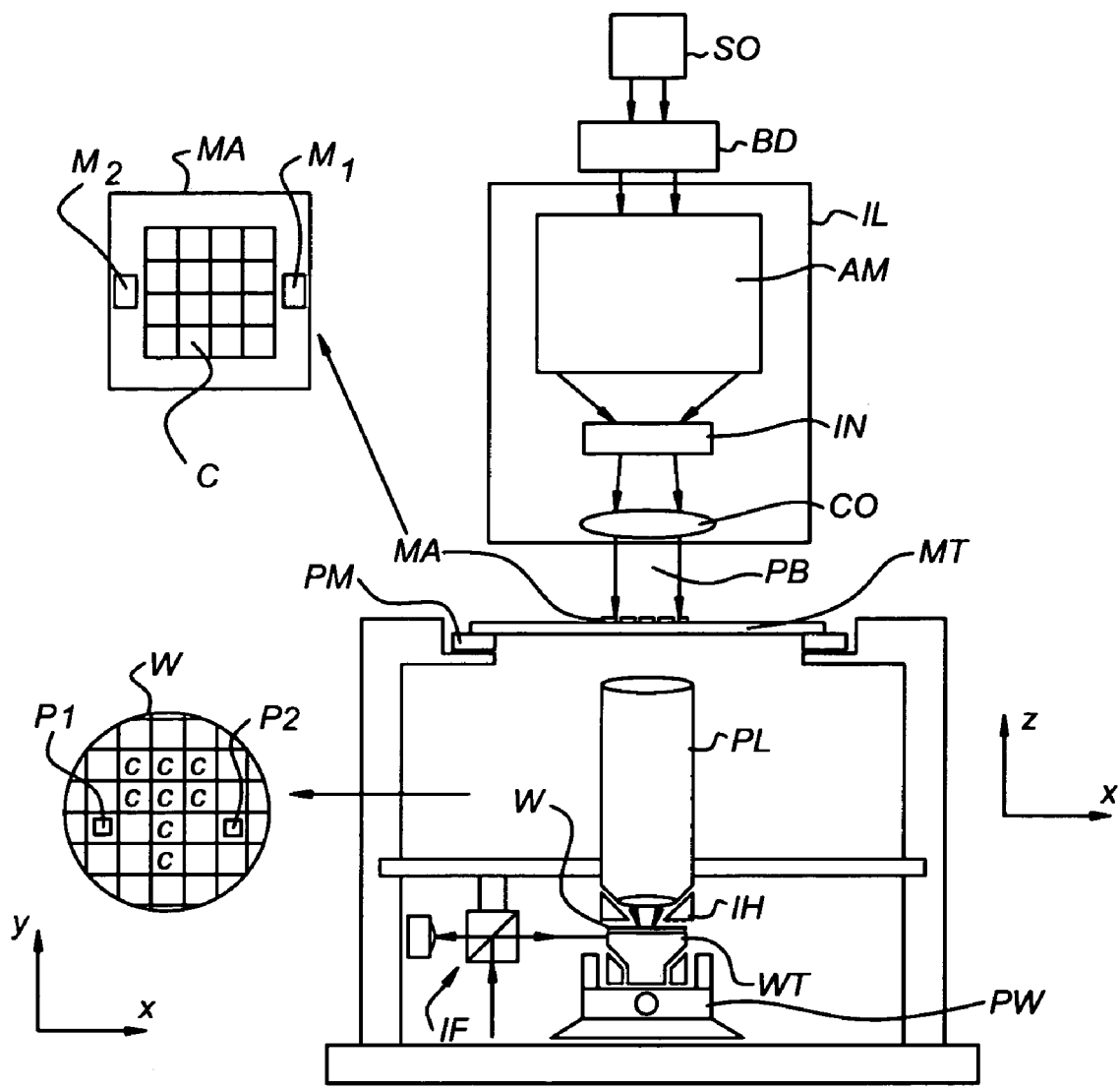
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation). A support (e.g. a mask table) MT is configured to support a patterning device (e.g. a mask) MA and connected to a first positioner PM configured to accurately position the patterning device in accordance with certain parameters. A substrate table (e.g. a wafer table) WT is configured to hold a substrate (e.g. a resist-coated wafer) W and connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
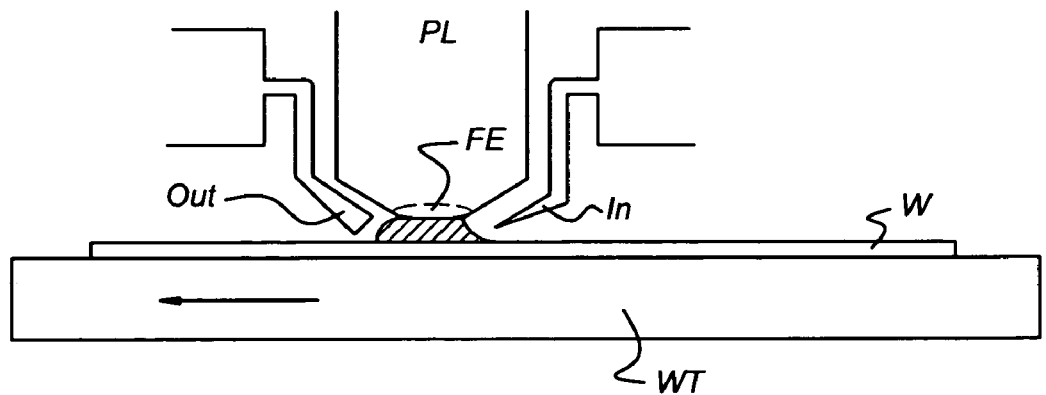
FIGS. 2 and 3 depict a liquid supply system used in a prior art lithographic projection apparatus.
Figure 3:
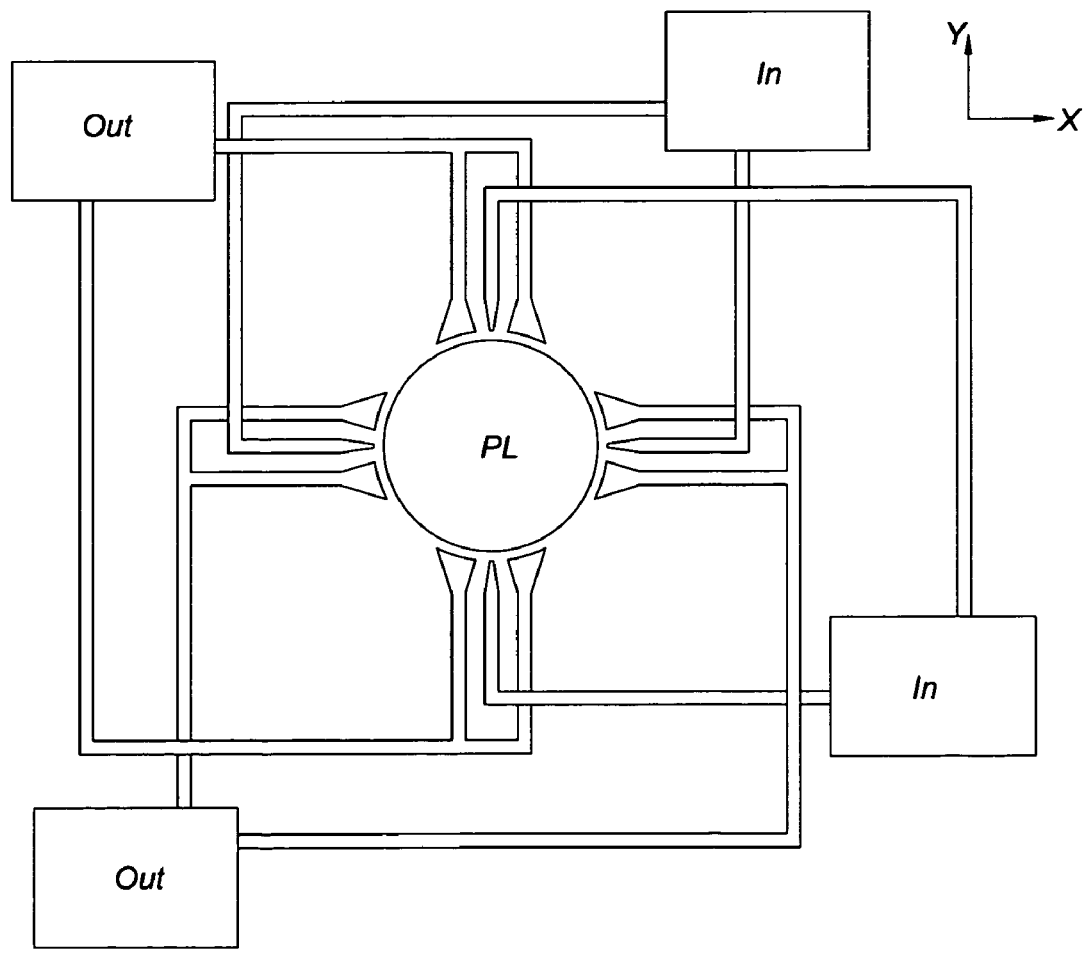

Different solutions are known to provide a lithographic apparatus using immersion techniques. A known system for providing a liquid is to use a system to provide liquid on only a localized area of the substrate W and in between a final element FE of the projection system PL and the substrate W using a liquid confinement system (the substrate generally has a larger surface area than the final element of the projection system). One known way to arrange for this is illustrated in FIGS. 2 and 3, in which liquid is supplied by at least one inlet IN onto the substrate W, preferably along the direction of movement of the substrate W relative to the final element FE, and is removed by at least one outlet OUT after having passed under the projection system PL. That is, as the substrate W is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible. One example is illustrated in FIG. 3 in which four sets of an inlet with an outlet on either side are provided in a regular pattern around the final element.

Figure 4A:
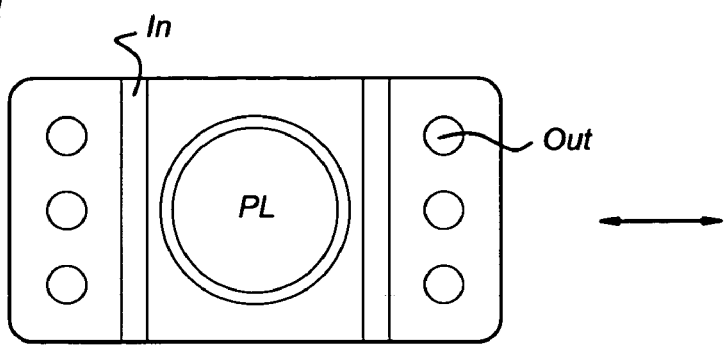
FIGS. 4a and 4b depicts a view from above and a side-view respectively of liquid supply system according to another prior art lithographic projection apparatus.
Figure 4B:
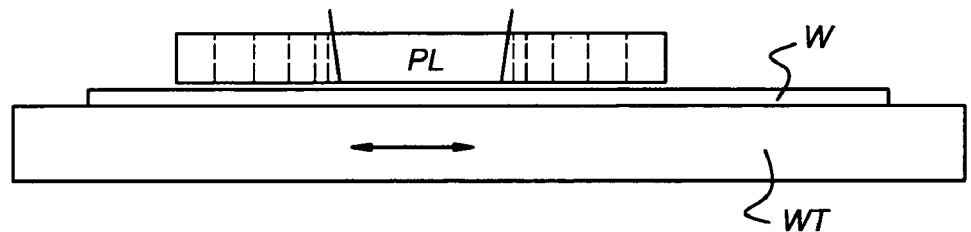

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal.

Figure 5:
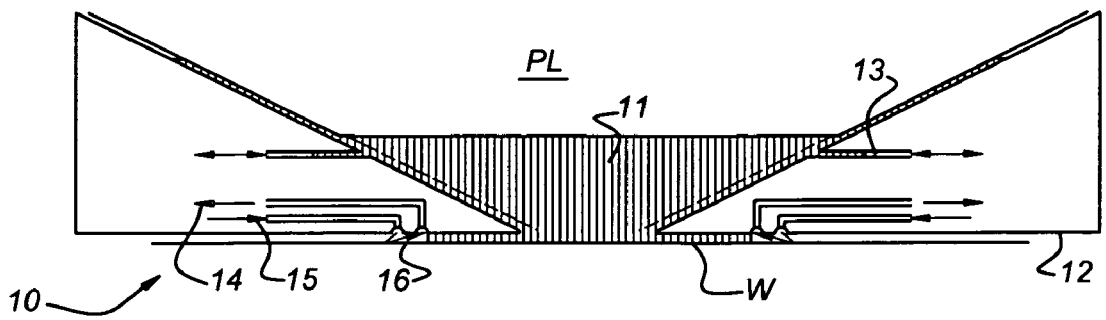
FIG. 5 depicts a further view of the liquid supply system according to a prior art lithographic projection apparatus.

According to the above mentioned U.S. patent application Ser. No. 10/959,403, liquid 11 is pumped into one side of the apparatus and out of the other side of the apparatus. As is depicted in FIG. 5, a reservoir 10 forms a contactless seal to the substrate W around the image field of the projection system PL so that liquid 11 is confined to fill a space between the substrate surface and the final element FE of the projection system PL. The reservoir 10 is formed by a seal member 12 positioned below and surrounding the final element FE of the projection system PL. Liquid 11 is brought into the space below the projection system PL and within the seal member 12. The seal member 12 extends a little above the final element FE of the projection system PL and the liquid level rises above the final element FE so that a buffer of liquid is provided. The seal member 12 has an inner periphery that at the upper end preferably closely conforms to the shape of the projection system PL or the final element FE thereof and may, e.g., be round. At the bottom, the inner periphery closely conforms to the shape of the image field, e.g., which is rectangular though this need not be the case.

The liquid 11 is confined in the reservoir 10 by a gas seal 16 between the bottom of the seal member 12 and the surface of the substrate W. The gas seal 16 is formed by gas, e.g. air or synthetic air but preferably $N_2$ or another inert gas, provided under pressure via an inlet 15 to a gap between seal member 12 and substrate W and extracted via a first outlet 14. An overpressure on the gas inlet 15, a substantially vacuum level on the first outlet 14 and geometry of the gap are arranged so that there is a high-velocity gas flow inwards that confines the liquid.

Figure 6:
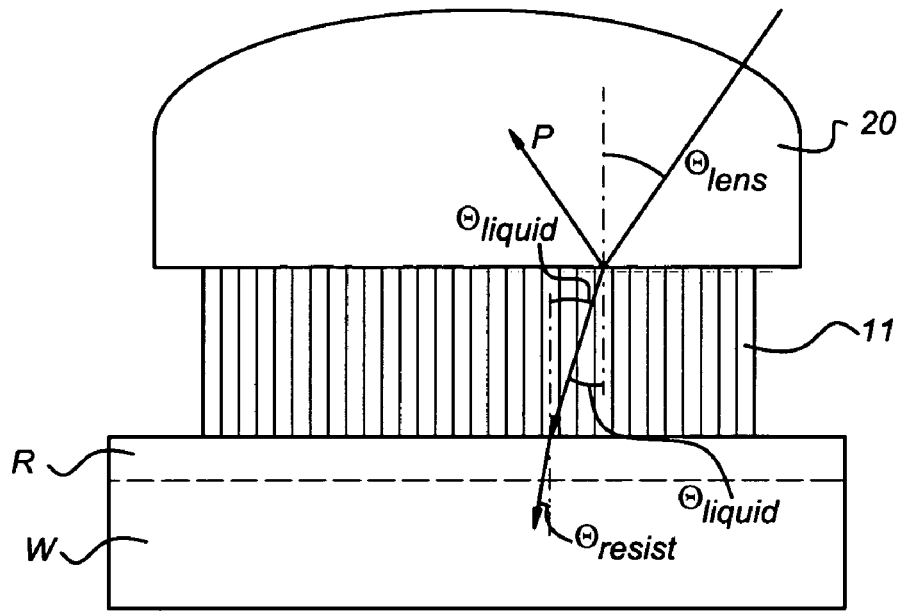
FIG. 6 depicts a final element of a projection system in a prior art lithographic projection system apparatus.

Turning to FIG. 6, the projection system PL includes a final element 20. The final element 20 is most commonly a spherical lens, though it could be another element such as a diffractive or refractive element. The liquid 11 is supplied between this final element 20 and the substrate W. FIG. 6 shows the element 20 as used in prior art lithographic apparatus. It is a planar convex lens.

For all optical rays, there is what is known as a sine-condition:

$$n_{resist} \sin \theta_{resist} = n_{liquid} \sin \theta_{liquid} = n_{lens} \sin \theta_{lens} \qquad (1)$$

where:

$n_{resist}$=refractive index of a resist layer R provided on the substrate, $n_{liquid}$=refractive index of the liquid 11, $n_{lens}$=refractive index of the lens, $\theta_{lens}$=angle between normal at lens-liquid boundary and radiation beam in the lens, $\theta_{liquid}$=angle between normal at lens-liquid boundary and radiation beam in the liquid, $\theta_{resist}$=angle between normal at liquid-resist boundary and radiation beam in the resist.

Note that formula (1) applies because the lens-liquid boundary and the liquid-resist boundary are substantially parallel. In other words, in order for an optical ray to pass unaffected through the final element FE (or lens 20 in this case), the liquid 11 and the resist layer R, this formula needs to balanced. This means that the lowest refractive index of the lens material, resist layer R or liquid limits the numerical aperture (NA) because:

$$NA = n_{lens} \sin \theta_{lens} \qquad (2)$$

If resists and liquids with a refractive index of greater than 1.56 are used, then the sine-condition can not be met at the lens-liquid boundary and total internal reflection occurs as shown in FIG. 6 with an arrow P. In order to solve this problem, the normal on the surface of the lens-liquid boundary is tilted by using a curved (concave) lens element 21. This enables a numerical aperture not to be limited by the refractive index of the lens material, but by the curvature of the lens surface.

In other words, because the refractive index ($n_{lens}$) is very difficult to increase, it is the $\sin \theta_{lens}$ which must be adjusted in order to balance formula (1).

Figure 7:
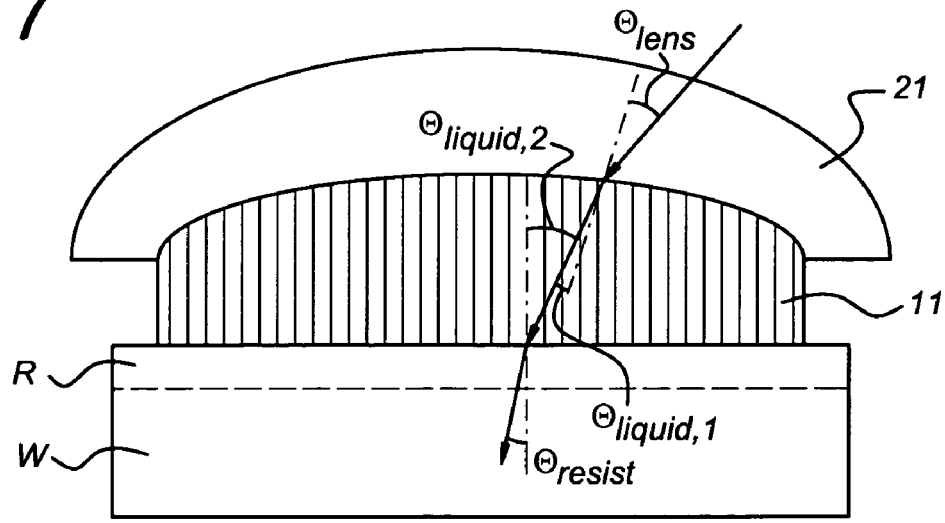
FIG. 7 depicts the final element of a projection system according to a prior art lithographic projection apparatus.

Tilting the lens-liquid boundary is achieved by using a lens 21 which has a convex face facing the incoming projected patterned beam and a concave face facing the outgoing projected patterned beam. This may, for instance, be a meniscus convex lens which has a positive radius of curvature at both of its opposing faces. By "positive" radius of curvature it is meant that if light were entering from the left, the lens face would be bulging towards the left. If both faces have a positive radius of curvature, the lens would be convex on the left and concave on the right. Looking at FIG. 7, the light is coming from the top of the page and so the lens bulges towards the top of the page.

Again, the sine-condition applies:

$$n_{liquid} \sin \theta_{liquid,1} = n_{lens} \sin \theta_{lens} \qquad (2)$$

and $$n_{liquid} \sin \theta_{liquid,2} = n_{resist} \sin \theta_{resist} \qquad (3)$$

where:

$n_{resist}$=refractive index of a resist layer R provided on the substrate, $n_{liquid}$=refractive index of the liquid 11, $n_{lens}$=refractive index of the lens, $\theta_{lens}$=angle between normal at lens-liquid boundary and radiation beam in the lens, $\theta_{liquid,1}$=angle between normal at lens-liquid boundary and radiation beam in the liquid, $\theta_{liquid,2}$=angle between normal at liquid-liquid boundary and radiation beam in the liquid, $\theta_{resist}$=angle between normal at liquid-resist boundary and radiation beam in the resist.

It is possible to use a lens with at least one negative radius of curvature, as long as the lens focuses the beam onto the substrate W.

The use of liquids with a refractive index which is as high as possible and therefore higher than that of the lens improves the resolution of the pattern image on the substrate.

However, the distance between the curved lens element 21 and the substrate W is relatively large, especially in the middle of the curved lens element 21. Near the edges of the curved lens element 21 the distance to the substrate W may be of the order of magnitude of approximately 2 mm. This approximately equals the distance between final element 20 (planar convex lens element) and the substrate W as depicted in FIG. 6. But at the centre of the curved lens element 21 the distance between the curved lens element and the substrate W is of the order of magnitude of approximately 20-30 mm.

As described above, and shown in FIG. 7, the curved lens element 21 as described in U.S. patent application Ser. No. 10/959,403 has a relatively large distance between the curved lens element 21 and the substrate W, in particular in the center of the curved lens element 21. In immersion applications, the space between the curved lens 21 and the substrate W is filled with liquid 11. It is known that liquid 11 may absorb a relatively large amount of the passing radiation. This absorption effect becomes stronger with decreasing wavelength, such as for instance in ultraviolet applications. Especially in cases where radiation is used having a relatively small wave length λ (such as ultraviolet radiation) the liquid layer may be too thick and may absorb too much radiation to enable exposure of the substrate W.

Also, the curved lens element 21 as described above, takes up a lot of space. This is caused by its concave shape.

Figure 8:
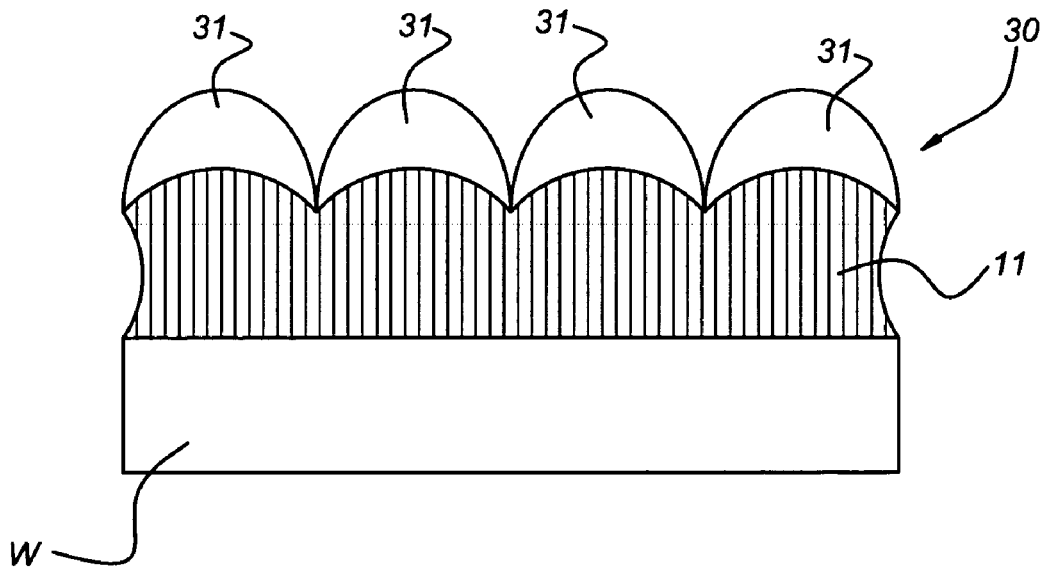
FIG. 8 schematically depicts a lens element according to an embodiment of the invention, FIGS. 9a and 9b schematically depict a top view of a lens element according to an embodiment of the invention, FIG. 9c schematically shows a top view of a slit, FIG. 10 schematically depicts part of a lithographic apparatus according to an embodiment of the invention, FIG. 11 schematically depicts a scan operation according to an embodiment of the invention, FIGS. 12a, 12b, and 12c schematically depict a scan operation at subsequent points in time according to an embodiment of the invention, FIG. 13 schematically depicts a scan operation according to an embodiment of the invention, FIG. 14 schematically depicts a lens element according to an embodiment of the invention.

FIG. 8 schematically depicts a lens element 30 according to an embodiment of the invention. Instead of a single curved lens element 21, a lens element 30 is provided including a plurality of curved lenses 31. In use, the lens element 30 is positioned close to substrate W also shown in FIG. 8. In between lens element 30 and substrate W liquid 11 is provided, as described above. In order to keep the liquid II in position, a liquid confinement system may be provided, as mentioned above (for instance shown in FIGS. 2-5).

Each curved lens 31 has a tilted lens-liquid boundary, achieved by providing a plurality of convex faces facing the incoming projected patterned beam and a plurality of concave faces facing the direction of travel of the projected patterned beam (in use facing the substrate W). This may, for instance, be a meniscus convex lens which has a positive radius of curvature at both of its opposing faces. By "positive" radius of curvature it is meant that if light were entering from a certain direction, the lens face would be bulging towards the same direction. If both faces have a positive radius of curvature, the curved lenses 31 would be convex on the left and concave on the right. Looking at FIG. 8, the light is coming from the top of the page and so the curved lenses 31 bulge towards the top of the page.

Figure 9A:
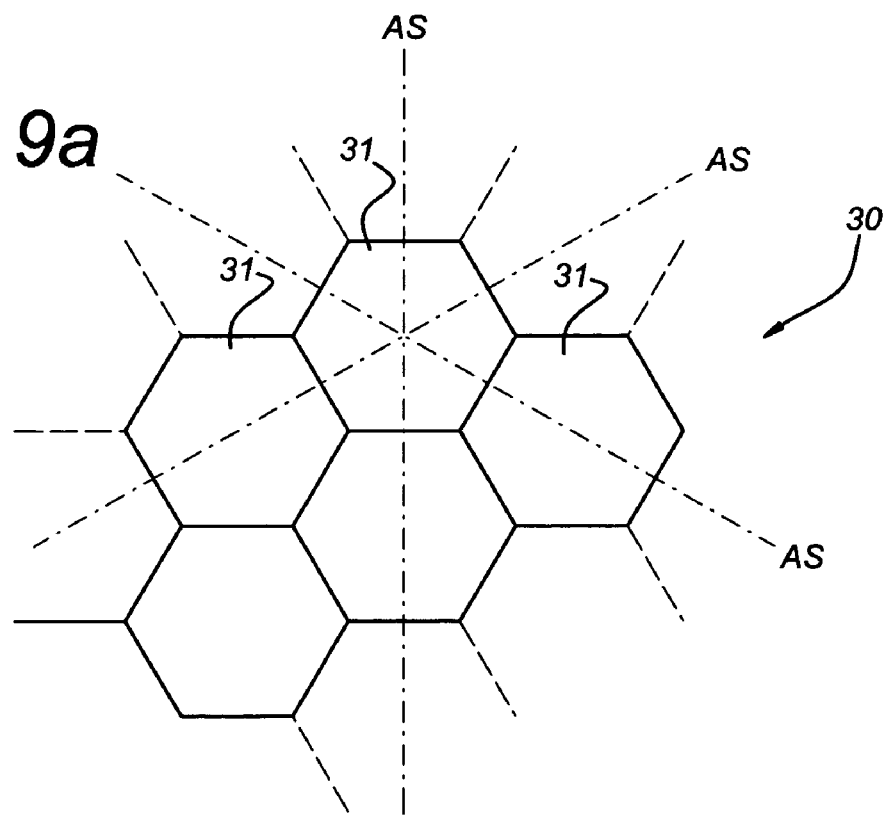

FIG. 9*a* shows a top view of an embodiment of the lens element 30. FIG. 9*a* clearly shows that lens element 30 includes a plurality of adjacent lenses 31. The lenses 31 are positioned in a honeycomb lens pattern. The term honeycomb structure is here used to denote a hexagonal lens pattern, in which each lens 31 has six closest neighboring lenses 31. In such a hexagonal lens pattern, axes of symmetry AS are present, as will be understood by a person skilled in the art.

The outer edges of the lens element 30 (not shown in FIG. 9*a*) may be substantially circular, just as the curved lens element 21, explained above with reference to FIG. 7. However, the outer edges of the lens element 30 may also be rectangular or may have any other suitable shape.

Figure 10:
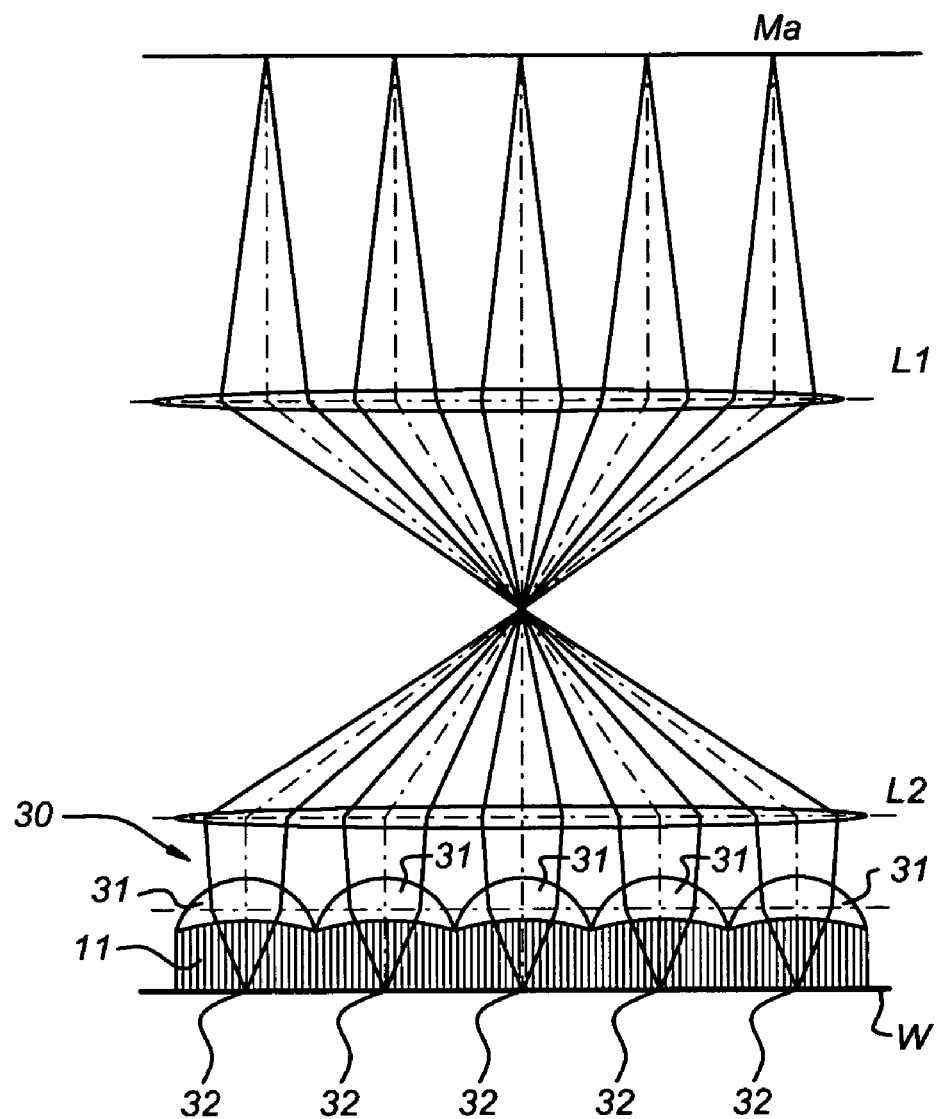

FIG. 10 schematically depicts a simplified example of part of a lithographic apparatus according to an embodiment of the invention. The figure shows a first lens group L1 and a second lens group L2, mask MA, lens element 30 and substrate W.

A patterned radiation beam B is generated with the aid of mask MA, the patterned radiation beam B passes through the first lens group L1 and the second lens group L2 before reaching lens element 30. In this simplified example, first lens group L1, second lens group L2 and lens element 30 together form the projection system PL. The lens element 30 focuses the patterned radiation beam on different sub-fields 32 on the substrate W.

Figure 11:
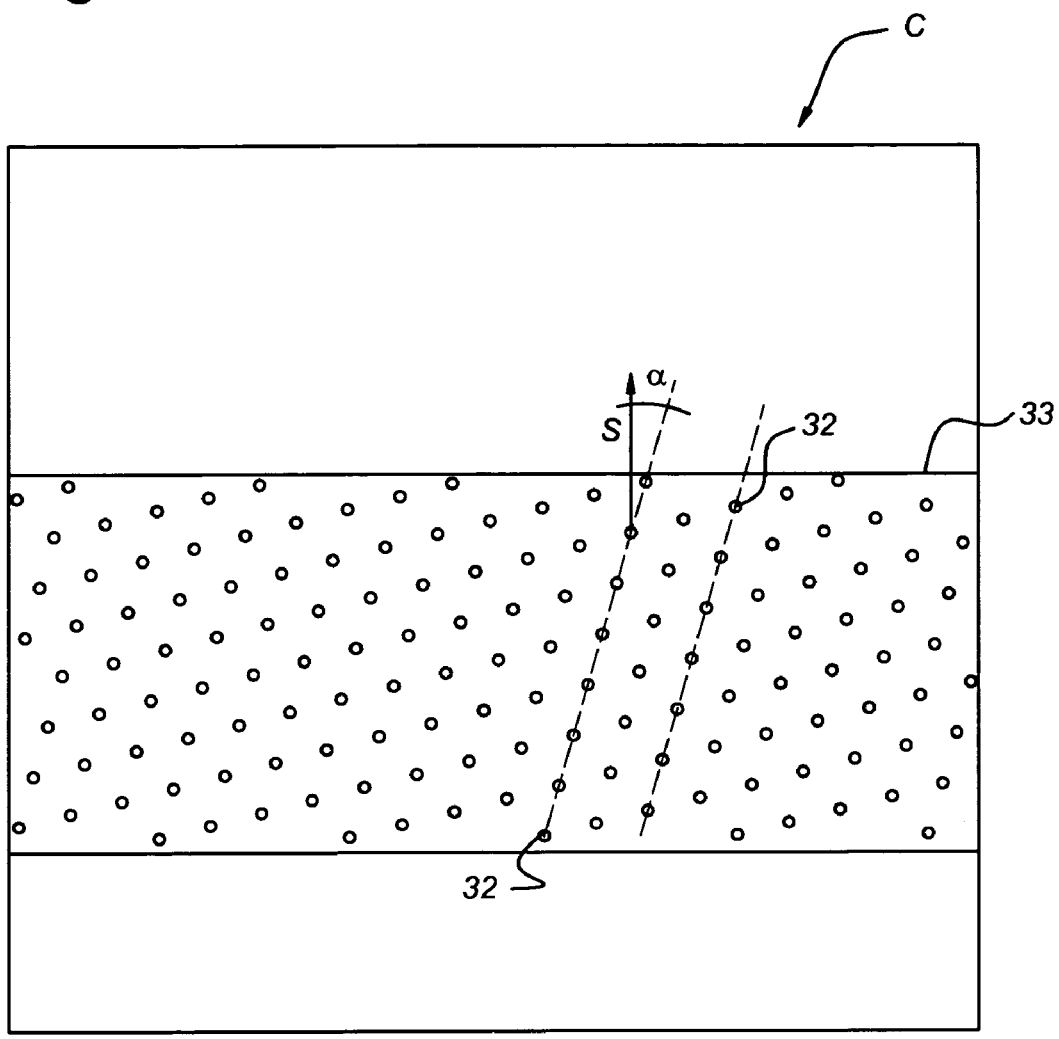

When the lithographic apparatus is operated in scan mode (as described above), the honeycomb pattern of sub-fields 32 may extend in a rectangular shape, called a slit 33, as is schematically depicted in FIG. 11. The slit 33 has a width that, at the substrate level, substantially corresponds to the width of the target portion C. The rectangular shape of the slit 33 may for instance be created by using blades (not shown) to block all radiation beams B' that are outside the slit 33. The blades may for instance be positioned close to reticle MA. Other devices known to persons skilled in the art to create slit 33 may be used. The slit may also have other shapes, such as a ring shaped slit. When used in a scanner it is important that the width of the ring segment is constant over the width of the ring segment.

The target portion C is fully exposed by moving slit 33 in a scan direction S over the target portion C. This may be done by scanning the mask MA through the radiation beam B in a given direction while synchronously scanning the substrate W parallel or anti-parallel to this direction (the "scanning"-direction S). Of course, the relative scan velocities of the mask MA and the substrate W should take into account the magnification factor of the optical elements positioned in between the mask MA and the substrate W. It will be understood by a skilled person that many variations are conceivable. As the substrate W is scanned, the pattern of the mask MA is written on the substrate W by sub-fields 32 created by the lenses 31 of the lens element 30. During the scan, the intensity of each sub-field 32 is modulated by the pattern on the mask MA. Thus, the pattern is transferred on the substrate W over time.

As a result of the scanning movement, each sub-field 32 will scan the target portion C. The lens pattern of the sub-fields 32 should be patterned and orientated in such a way, that the entire target portion C is uniformly exposed after one scanning movement. Therefore, in an embodiment the axes of symmetry of the honeycomb structure are not aligned with the scanning direction S, but are at an angle a with respect to the scanning direction S, as is indicated in FIG. 11. By doing so, the entire target portion C is uniformly exposed, i.e. each part of the target porion C is exposed by the same amount of sub-fields.

Figure 9B:
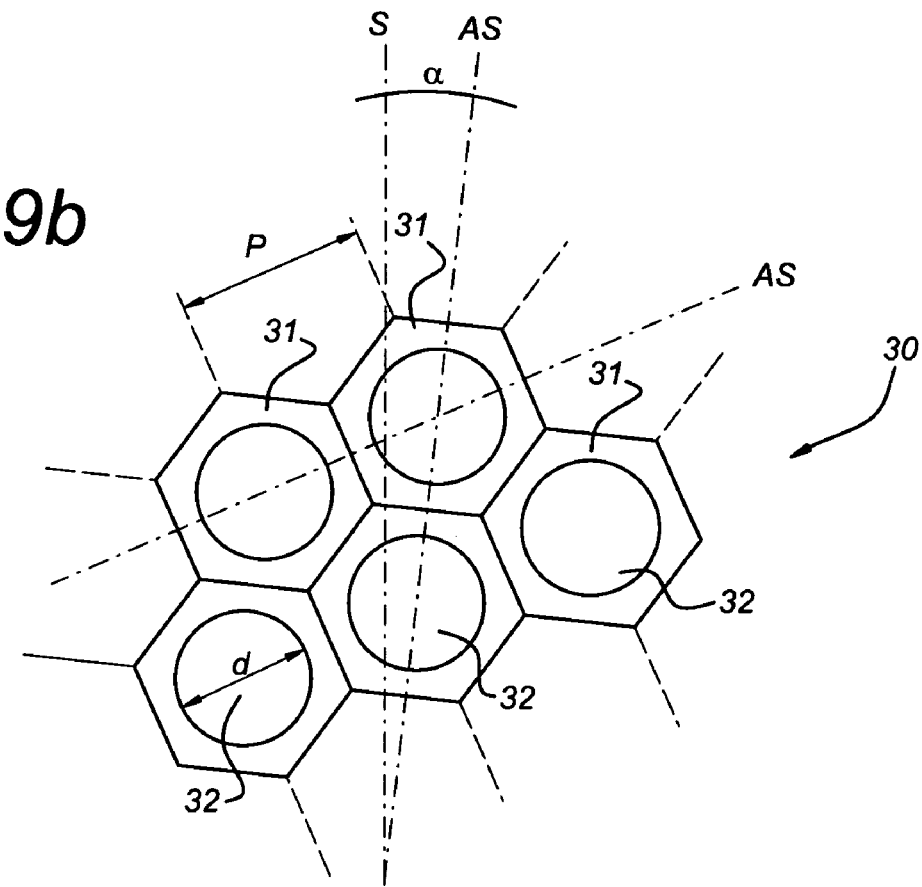
Figure 9C:
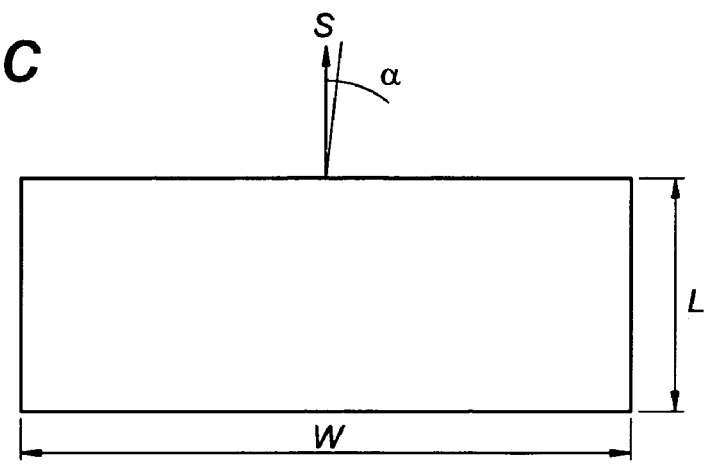

In order to ensure proper exposure of the entire target portion C, the following requirements can be formulated. Referring to FIGS. 9b and 9c, it can be seen that the sub-fields 32 are smaller than the lens 31. The sub-fields 32 have a diameter of approximately d, and the pattern of lenses 31 have a pitch of approximately p, where p>d. Further, the slit 33 has a width W and a length L. A typical size for W=26 mm and L=10 mm. Also indicated in FIG. 9b is the scan direction S and the angle $\alpha$ at which the pattern is positioned with respect to the scan direction S.

To ensure equal exposure of all parts of the target portion in an embodiment, the following relation applies: $\alpha > d/L$. When the pattern of lenses 31 is looked at in the direction of scanning S, the lenses 31 slowly stagger due to their angled orientation. This relation ensures that they are at least staggered a distance equal to diameter d over the distance L.

It is further noted that the resolution of the imaged pattern may be much smaller than the diameter d of the sub-fields 32 and the pitch p of the lens pattern. It is noted that the sub-fields 32 are actually sub-fields of the total field as it would have been projected by a single lens element as described above in relation to the prior art. Therefore, the sub-fields 32 include a part of the pattern that is to be imaged.

Figure 12A:
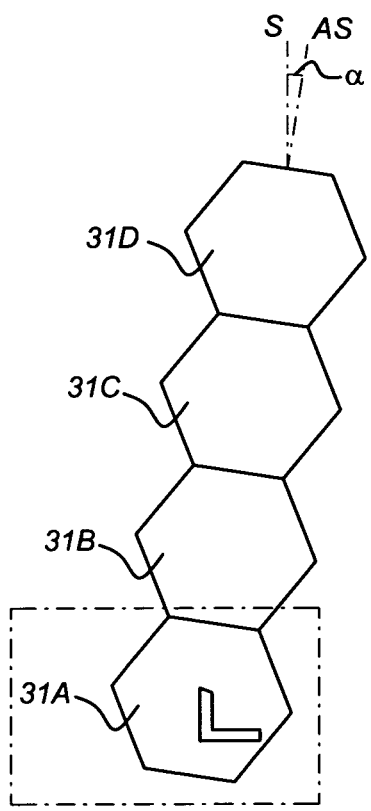
Figure 12B:
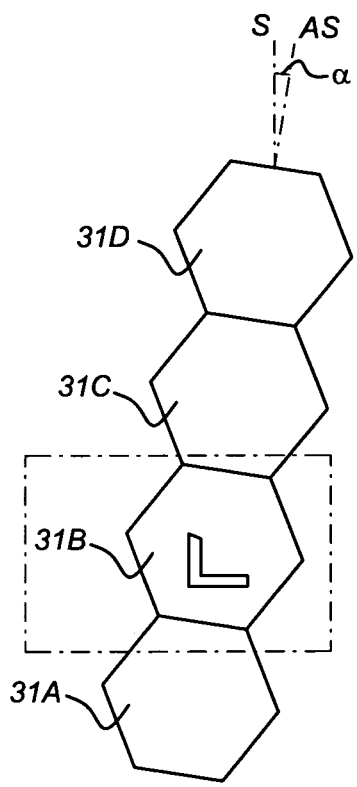
Figure 12C:
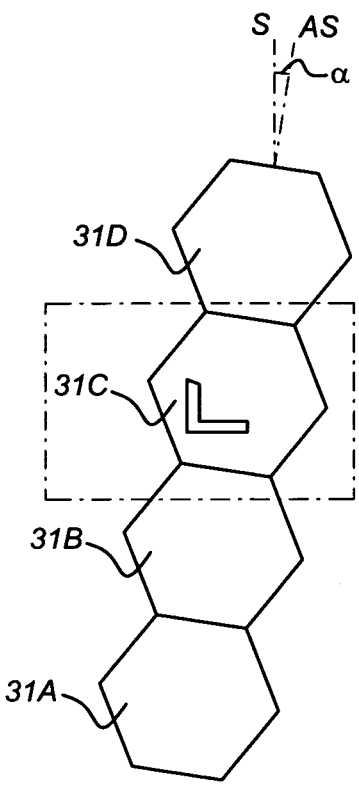

FIG. 12a, 12b, and 12c schematically show a scanning procedure at subsequent points in time ($t_1$, $t_2$, $t_3$) of a lens element 31 according to this embodiment. The figures depict four lenses 31A, 31B, 31C, 31D of lens element 30.

FIG. 12a shows a L-shaped feature being imaged by first lens 31A at a first point in time $t_1$. As already described above, the mask MA and the substrate W both move in a scanning motion with respect to each other, so at point $t_2$ ($>t_1$), the L-shaped feature is being imaged by a next lens 31B. It can be seen in FIG. 12a, 12b and 12c that the pattern formed by lenses 31A, 31B, 31C and 31D is at an angle $\alpha$ with respect to the scanning direction S.

As a result, the L-shaped feature has a different relative position with respect to lens 31B in comparison with lens 31A and 31C, the latter being shown in FIG. 12c. FIG. 12c shows the situation at a time $t_3$ ($t_3 > t_2$)

According to a further embodiment, the lenses 31 of the lens element 30 are not patterned in a honeycomb structure, but in a rectangular lens pattern. Of course, any other suitable lens pattern could be used.

It will be understood that, different patterns may be used for lenses 31 of the lens element, such as for instance a honeycomb structure, or a rectangular structure. It will be understood that many other patterns may be used.

The pattern may be rotationally symmetric in order to minimize astigrnatism, i.e. differences between the exposure results in dependence on the orientation of the pattern exposed. The lenses 31, may further be positioned to have a relatively close packing, in order to optimize the amount of light that can be exposed.

In order to achieve uniform exposure results, the pattern should be tilted with respect to the scanning direction, as explained above.

From the above it will be apparent that an angle $\alpha$ may be present between the axis of symmetry of the lens pattern of lenses 31 and the scan direction S. This angle a may be chosen carefully taken into account the amount of lenses 31, their mutual orientation and distance.

In the examples given above, the scan direction S is substantially aligned with the outer edges of the target portion C. However, according to a third embodiment, the scan direction could be angled with respect to the target portion C, while the orientation of the lens pattern of the lenses 31 is substantially aligned with the outer edges of the target portion C.

Figure 13:
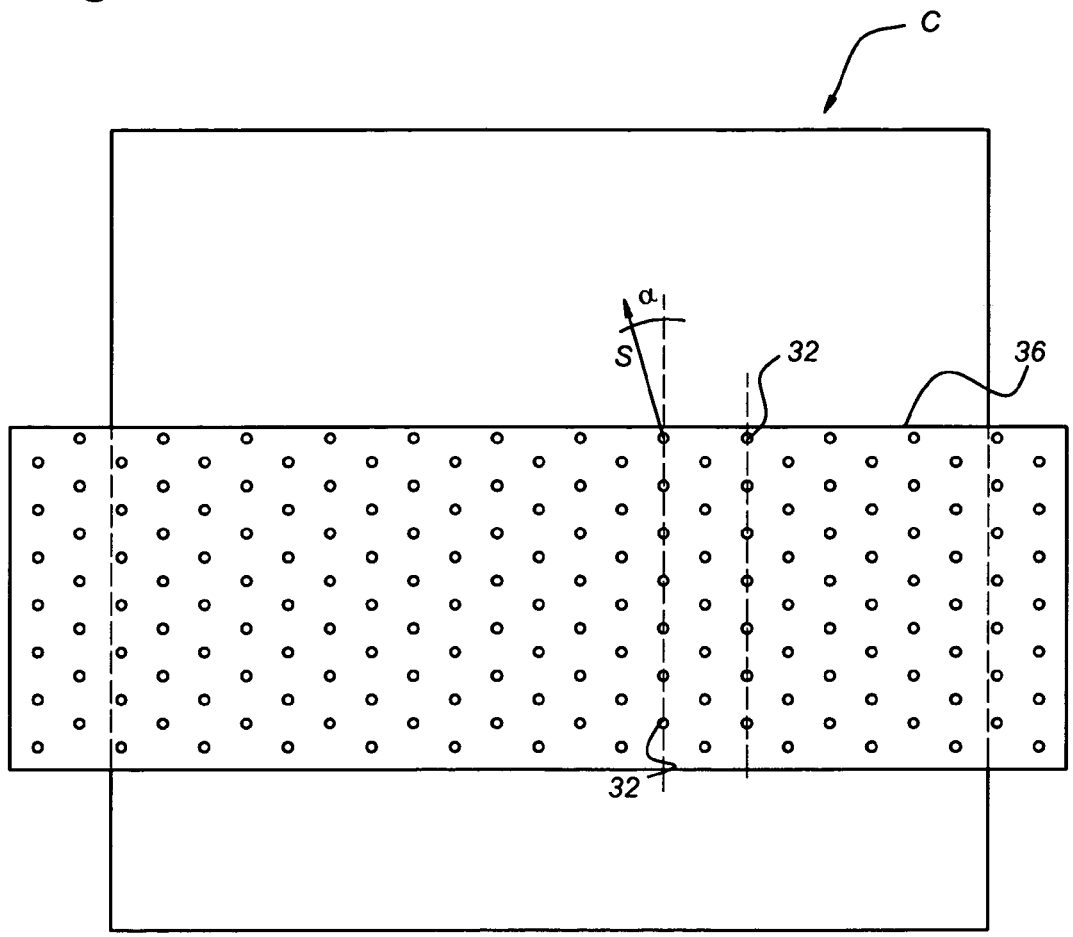

Such an embodiment is schematically depicted in FIG. 13, where a slit 36 is filled with a pattern of sub-fields 32, corresponding to the lens pattern, arranged in a honeycomb lens pattern, of which the axes of symmetry are substantially aligned with the orientation of the target portion C. The scan direction S' is angled with respect to the axes of symmetry of the honeycomb lens pattern. It can be seen in FIG. 13 that slit 36 has a width that is larger than the width of the target portion C, to allow an angled scanning direction S', while still exposing the entire target portion C.

Of course, according to a further embodiment, also a mix of these two variants could be employed, where both the axis of symmetry of the lens pattern of lenses 31 as well as the scanning direction is angled with respect to the orientation of the target portion C, and are angled with respect to each other.

Again, the scanning movement may be realized by moving both the mask MA and the substrate W in a mutual co-ordinated movement (parallel or anti-parallel). However, the scanning movement may also be realized in other ways.

Figure 14:
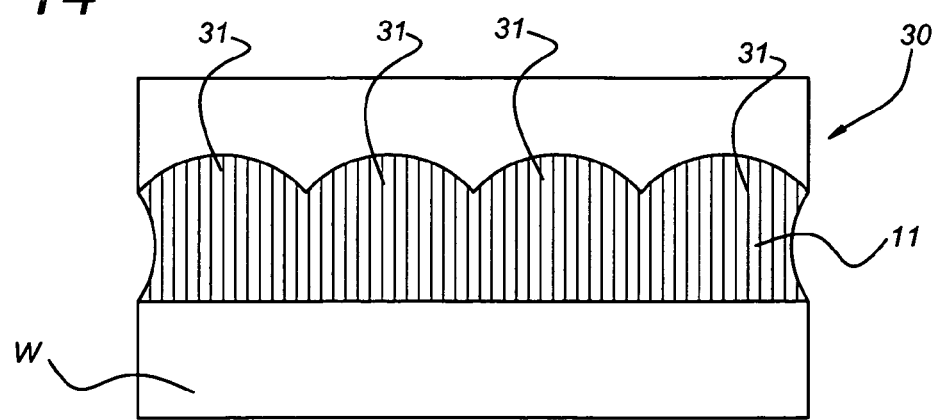

Lens element 30 as schematically depicted in FIG. 8 is only an example and it will be understood that alternatives may be conceived. For instance, FIG. 14 shows a lens element 30 including a plurality of curved lenses 31 according to a further embodiment. Each curved lens 31 is formed by a lens element, having a tilted lens-liquid boundary, achieved by using a lens which has a planar face facing the incoming projected patterned beam and a plurality of concave shaped lens parts, facing the outgoing projected patterned beam (in use facing the substrate W).

It will be clear from the above that in each embodiment, the lens pattern, the mutual distance and the orientation of the lenses 31 of the lens element 30 can be chosen such that the entire target portion C is exposed after a scanning procedure. If these parameters are not chosen correctly, different parts of the target portion C might be subject to different exposure conditions, i.e. some areas may not be exposed at all and/or other areas may be exposed twice (or even more often) after a scanning procedure, resulting in a non-uniform exposure of the target portion C.

According to the embodiments above, the lenses 31 of the lens element 30 are positioned in a honeycomb lens pattern (hexagonal lens pattern) or a rectangular lens pattern. It will however be understood that any other suitable lens pattern of lenses 31 may be used. In each case, the axis of symmetry of the lens pattern of lenses should be tilted with respect to the scanning direction.

It will also be understood by a skilled person, that sub-fields 32 are not perfectly sharp-defined circular sub-fields, but have an intensity distribution that is decreasing towards the outer edges of the sub-fields 32. However, by carefully choosing the pattern of the sub-fields 32 and the angle α, the entire target portion C is exposed uniformly. If we define y as the scanning direction, and x as the non-scanning direction, being substantially perpendicular with respect to the y direction and parallel with the surface of the target portion C, the illumination intensity integrated over y should result in a constant number over x. In other words, the illumination intensity should be uniform after the exposure.

The above invention may be used for all kinds of radiation beams, such as 248, 193, 157, 126 nm, but also any other suitable wavelength could be used. Also, although the description above is mainly about lithographic apparatus using immersion techniques, it will readily be understood that the invention may also be used in any lithographic apparatus, as well as in other imaging systems.

According to an embodiment, the refractive index of the liquid is greater than that of the lens element 30. For instance, the liquid 11 may have a refractive index greater than 1.56 and the lens element 30 may be made of fused silica with a refractive index of 1.56.

By providing lens element 30 including a plurality of lenses 31, the distance between the lens element 30 and the substrate W can be reduced, so the optical path of the radiation beam B through liquid 11 is significantly reduced. As a result, the use of liquids having a higher refractive index is allowed. This increases the numerical aperture NA of the system.

Also, reducing the optical path allows the use of radiation beams B having a smaller wavelength λ. It is known that the absorption of radiation by a liquid increases with decreasing wavelength. Therefore, reducing the optical path of the radiation beam B through the liquid, allows using radiation beams B having smaller wavelengths λ.

As a result, the system is capable of imaging smaller patterns on a substrate W, as the resolution RES of an optical system is given by:

$$RES = \frac{\lambda}{NA}$$

According to an embodiment, the liquid 11 has a first refractive index and the final element has a second refractive index, the first refractive index being greater than the second refractive index.

The first refractive index may be greater than 1.56. The liquid may be water.

The lens element 30 includes a plurality of lenses 31, arranged in a pattern. Lens element 30 may be manufactured from a single monolithic piece of material, in which concave and convex parts are etched, to form lenses 31. This may for instance be done by using lithographic techniques.

Lens element 30 may however also be formed by a plurality of separately formed lenses 31, that are put together to form lens element 30. This may for instance be done by pressing all lenses 31 together in a frame (not shown). Of course, any other suitable way of manufacturing a lens element 30 may be applied.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lens element, comprising a first face and a second face, the first face comprising a plurality of concave shaped solid lens parts and the second face comprising a plurality of convex shaped lens parts, each lens part arranged to focus a portion of a beam, incident on the second face, via a liquid on a single flat surface, and each lens part configured to be unattached to the flat surface, wherein each convex shared lens part corresponds to a concave shaped lens part to form a set, such that each set of a concave and convex shaped lens part functions as a lens.

2. A lens element according to claim 1, wherein the plurality of concave shaped lens parts are arranged in a honeycomb lens pattern.

3. A lens element according to claim 1, wherein the plurality of concave shaped lens parts are arranged in a rectangular lens pattern.

4. A lithographic apparatus comprising a projection system arranged to form a projected pattern from a patterning device onto a substrate, the projection system comprising a final element, the final element being arranged to focus the projected pattern onto the substrate, wherein the final element is a lens element comprising a first face and a second face, the first face comprising a plurality of concave shaped solid lens parts, each lens part arranged to focus a portion of a beam, incident on the second face, via a liquid on a single flat surface, of which the first face is arranged to face the substrate, and each lens part configured to be unattached to the flat surface, wherein the lithographic apparatus is arranged to project the pattern from the patterning device onto the substrate by scanning the pattern through a radiation beam in a scanning direction while synchronously scanning the substrate either parallel or anti-parallel to this direction, and the plurality of concave shaped lens parts are arranged in a lens pattern having an axis of symmetry, where the scanning direction and the axis of symmetry are angled with respect to each other.

5. A lithographic apparatus according to claim 4, wherein the projection system includes a liquid supply configured to supply a liquid to a space between the first face of the final element of the projection system and the substrate.

6. A lithographic apparatus according to claim 5, wherein the liquid has a first refractive index and the final element has a second refractive index, the first refractive index being greater than the second refractive index.

7. A lithographic projection apparatus according to claim 6, wherein the first refractive index is greater than 1.56.

8. A lithographic projection apparatus according to claim 4, wherein the lens element is made of fused silica with a refractive index of substantially 1.56.

9. A lithographic projection apparatus according to claim 5, wherein the liquid is water.

10. A lithographic projection apparatus according to claim 4, wherein an exposure slit containing the projected pattern has a length L in the scanning direction, the axis of symmetry is at an angle $\alpha$ with respect to the scanning direction, the concave shaped lens parts are at a distance d from each other, and $\alpha > d/L$.

11. A lithographic projection apparatus according to claim 4, wherein the total amount of sub-fields of the final element in the scanning direction, is constant over the final element in a direction being substantially perpendicular with respect to the scanning direction.

12. A device manufacturing method comprising;
providing a radiation beam;
patterning the radiation beam; and
projecting the patterned radiation beam onto a target portion of a substrate using a projection system compromising a lens comprising a first face and a second face, the first face comprising a plurality of concave shaped solid lens parts, each lens part arranged to focus a portion of a beam, incident on the second face, via a liquid on a single flat surface.

13. A device manufacturing method according to claim 12, in which a target portion is irradiated by scanning the patterned radiation beam in a scanning direction while synchronously scanning the substrate either parallel or anti-parallel to the scanning direction.

14. A device manufacturing method according to claim 13, where the plurality of lens parts are oriented in a pattern having at least one axis of symmetry, the axis of symmetry being angled with respect to the scanning direction.

15. A device manufactured according to the method of claim 12.

16. A lens element according to claim 1, wherein the lens element is made of fused silica with a refractive index of substantially 1.56.

17. A device manufacturing method according to claim 14, wherein an exposure slit containing the patterned radiation beam has a length L in the scanning direction, the axis of symmetry is at an angle $\alpha$ with respect to the scanning direction, the concave shaped lens parts are at a distance d from each other, and $\alpha > d/L$.

18. A device manufacturing method according to claim 14, wherein the total amount of sub-fields of the lens in the scanning direction, is constant over the lens in a direction substantially perpendicular with respect to the scanning direction.

19. A device manufacturing method according to claim 12, wherein the liquid has a first refractive index and the lens has a second refractive index, the first refractive index being greater than the second refractive index.

20. A device manufacturing method according to claim 19, wherein the first refractive index is greater than 1.56.

* * * * *